(12) United States Patent
Kitazawa

(10) Patent No.: US 7,676,774 B2
(45) Date of Patent: Mar. 9, 2010

(54) SYSTEM LSI VERIFICATION SYSTEM AND SYSTEM LSI VERIFICATION METHOD

(75) Inventor: Tomoko Kitazawa, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 379 days.

(21) Appl. No.: 11/749,468

(22) Filed: May 16, 2007

(65) Prior Publication Data
US 2007/0271533 A1 Nov. 22, 2007

(30) Foreign Application Priority Data
May 17, 2006 (JP) .............................. 2006-137771

(51) Int. Cl.
*G06F 17/50* (2006.01)
*G06F 9/45* (2006.01)
(52) U.S. Cl. ................................... 716/4; 716/1; 716/5
(58) Field of Classification Search ...................... 716/1, 716/4, 5
See application file for complete search history.

(56) References Cited

U.S. PATENT DOCUMENTS

| | | | |
|---|---|---|---|
| 6,578,174 B2 * | 6/2003 | Zizzo | 716/1 |
| 7,032,202 B2 * | 4/2006 | Guettaf et al. | 716/7 |
| 7,260,795 B2 * | 8/2007 | Maturana et al. | 716/4 |
| 7,308,668 B2 * | 12/2007 | Bueti et al. | 716/8 |
| 7,386,827 B1 * | 6/2008 | Zhu et al. | 716/16 |
| 7,484,188 B2 * | 1/2009 | Duan et al. | 716/4 |
| 2002/0038401 A1 * | 3/2002 | Zaidi et al. | 710/305 |
| 2009/0083680 A1 * | 3/2009 | McConaghy et al. | 716/3 |

FOREIGN PATENT DOCUMENTS

JP 2003-323463 11/2003

* cited by examiner

*Primary Examiner*—Thuan Do
*Assistant Examiner*—Magid Y Dimyan
(74) *Attorney, Agent, or Firm*—Oblon, Spivak, McClelland, Maier & Neustadt, L.L.P.

(57) ABSTRACT

According to one embodiment, a system LSI verification system that verifies a processor module included in a system LSI, the system comprising: a circuit description storage that stores description data that describes a design of the processor module; a verification task generator that generates a verification task file based on the description data and a verification environment specification file in which specifications of a verification environment are described; a test program storage that stores a test program including an environment command function for starting the verification task; and a logical simulator that performs a logical simulation according to the test program.

12 Claims, 9 Drawing Sheets

FIG. 3

21 GLOBAL MEMORY MAP FILE

```
// GLOBAL MEMORY MAP
// start:size:name:cache:memory_original_start:scope:type:read_write:
 :0x0000_0000:0x0020_0000:RAM1      :           :            :global:memory:ro;
 :0x0080_0000:0x0080_0000:RAM2:Cache :0x00000000 :global:memory:rw;
 :0x8080_0000:0x0080_0000:RAM3      :           :0x00000000  :global:memory:rw;
```

FIG. 4

22 LOCAL MEMORY MAP FILE

```
// LOCAL MEMORY MAP
 :RAM1        :0x0000_0000:0x0020_0000:         :global:ro::memory;
 :Imem0       :0x0020_0000:0x0000_2000:         :local:rw::Imem;
 :Imem1       :0x0020_2000:0x0000_2000:         :local:rw::Imem;
 :dmem0       :0x0020_8000:0x0000_4000:         :local:rw::dmem;
 :dmem1       :0x0020_c000:0x0000_4000:         :local:rw::dmem;
 :Icache_dat  :0x0030_0000:0x0000_4000:         :local:rw::Icache_data;
 :Icache_tag  :0x0031_0000:0x0000_4000:         :local:rw::Icache_tag;
 :RAM2        :0x0080_0000:0x0080_0000:cache    :global:rw::memory;
 :RAM3        :0x8080_0000:0x0080_0000:         :global:rw::memory;
```

FIG. 5

23 CONTROL BUS ADDRESS MAP FILE

```
// CONTROL BUS ADDRESS MAP
 :INTC        :0x0000:0x0800;
 :Reserved1   :0x0800:0x0800;
 :DMAC        :0x1000:0x2000;
 :Reserved2   :0x3000:0x1000;
 :HWE1        :0x4000:0x1000;
 :HWE2        :0x5000:0x1000;
 :HWE3        :0x6000:0x1000;
 :Reserved3   :0x7000:0x9000;
```

FIG. 6

```
//COMMON PORTION
----------------------------------------------------------------------
#define ADR_base       32'ha00               //START ADDRESS OF VERIFICATION RESERVED AREA
#define ADR_base1      32'hb00               //START ADDRESS OF VERIFICATION RESERVED AREA OF MODULE A
#define ADR_base2      32'hc00               //START ADDRESS OF VERIFICATION RESERVED AREA OF MODULE B
define ADR_Ver        ADR_base+32'h000      //version //END OF TEST PROGRAM AND FILE OUTPUT OF END STATUS
define ADR_exit       ADR_base+32'h004      //END
#define ADR_exitStatus ADR_base+32'h008      //END STATUS 0:PASS, EXCEPT 0:FAIL
#define ADR_exitVer    ADR_base+32'h00c      //RESERVATION FOR FUNCTION ADDITION  *
//MEMORY PROCESS
//MEMORY FILE OUTPUT
#define ADR_memDumpAddr  ADR_base+32'h010    //START ADDRESS
#define ADR_memDumpSize  ADR_base+32'h014    //SIZE TO BE OUTPUT (Byte NUMBER)
#define ADR_memDumpFlag  ADR_base+32'h018    //RESERVATION FOR FUNCTION ADDITION  *
//MEMORY COMPARISON AREA A vs. B
#define ADR_memCmpAaddr  ADR_base+32'h020    //START ADDRESS OF AREA A
#define ADR_memCmpBaddr  ADR_base+32'h024    //START ADDRESS OF AREA B
#define ADR_memCmpSize   ADR_base+32'h028    //SIZE TO BE COMPARED (Byte NUMBER)
#define ADR_memCmpResult ADR_base+32'h02c    //COMPARED RESULT 0: CONSISTENCY EXCEPT 0: INCONSISTENCY
#define ADR_memCmp_Flag  ADR_base+32'h030    //RESERVATION FOR FUNCTION ADDITION  *
//EXTERNAL I/O CONTROL
#define ADR_systemReset  ADR_base+32'h100    //ASSERT A RESET
#define ADR_extVer       ADR_base+32'h104    //RESERVATION FOR FUNCTION ADDITION  *
----------------------------------------------------------------------

//PORTION PECULIAR TO THE MODULE A
----------------------------------------------------------------------
#ifdef_Module_A_
define ADR_ID          ADR_base1+32'h000    //ID //EXTERNAL I/O CONTROL OF THE MODULE A
define ADR_A_xInt      ADR_base1+32'h004    //ASSERT AN INTERRUPT SIGNAL FROM A MODULE x
#define ADR_A_yInt      ADR_base1+32'h008    //ASSERT AN INTERRUPT SIGNAL FROM A MODULE y
#define ADR_A_extVer    ADR_base1+32'h00c    //RESERVATION FOR FUNCTION ADDITION  *
#endif
```

30  VERIFICATION RESERVED AREA DEFINITION FILE

SYSTEM LSI VERIFICATION SYSTEM AND SYSTEM LSI VERIFICATION METHOD

CROSS-REFERENCE TO RELATED APPLICATIONS

This application is based upon and claims the benefit of priority from the prior Japanese Patent Applications No. 2006-137771, filed on May 17, 2006; the entire contents of which are incorporated herein by reference.

BACKGROUND

One embodiment of the invention relates to a system LSI verification system and a system LSI verification program that verifies a processor module contained in a system LSI.

On account of the recent progress of digital equipments, the system LSI (Large Scale Integration) capable of implementing the functions that are required of respective digital equipments is needed. In contrast, with the diversification of the functions of the digital equipments, the functions that are required of the system LSI are also diverse. In order to deal with this diversification, in some cases the multi-processor construction having an extended function customized based on a common processor core to meet the process is employed.

In some cases this extended function is implemented by the configurable processor in which instructions, memory structures, and the like can be selected. Also, the provider of the configurable processor provides the system that outputs the hardware description that can be logically synthesized by pointing the configuration. According to such processor and system, the processor having the configuration that is most suitable for the application can be developed in a short term by pointing the optional instruction and the memory size.

Meanwhile, when the instruction set, and the like are changed in the system LSI, the software development tools such as complier, simulator, etc. must also be changed. Therefore, the new hardware description and the software development tools that deal with the new hardware must be generated by pointing the configuration.

In order to develop effectively the system LSI having such multi-processor construction, there is the system LSI development environment generating method set forth in JP-A-2003-323463. When the configuration pointing file in which the instruction operations of the processor are described is input by the method set forth in JP-A-2003-323463, RTL (Register Transfer Language), compiler, assembler, simulator, verification vector, and debugger are automatically constructed.

According to the method set forth in above Patent Literature 1, functions can be verified in unit of processor core in the processor module of the system LSI. However, such a problem lies that functions cannot be verified in unit of processor module that is contained in plural in the system LSI.

For this reason, the processor module verification environment must be generated every system LSI development that is associated with the application. Therefore, there are such a problem that, when a change of design specifications of the hardware and the firmware is caused, it takes much time to change the verification environment and the test program.

In addition, there exits such a problem that, when there are the portions whose verification environment is different mutually among a plurality of processor modules contained in one system LSI, change and management of the verification environment become more complicated.

Therefore, in order to increase a verification precision and reduce a term and a cost required for the verification, the method of reusing effectively the verification environment and the test program is requested.

Meanwhile, since the design proceeds along with the hierarchy of the architecture in the hardware development, the function verification is carried out separately at several stages every circuit scale or function, or is carried out in parallel with the hardware development. The verification environment containing the function that does the RTL simulation by compiling the test program applied to verify these hardwares is carried out by the method that is independent of respective verification steps. Accordingly, even when the test program is described in high-level language such as the C language, or the like, a change must be made in the test program to meet the individual verification environment. As a result, such a problem arises that the test program becomes complicated and also a huge cost is required to change the test program as the number of programs is increased.

SUMMARY

According to one embodiment of the present invention, a system LSI verification system that verifies a processor module included in a system LSI, the system comprising: a circuit description storage that stores description data that describes a design of the processor module; a verification task generator that generates a verification task file based on the description data and a verification environment specification file in which specifications of a verification environment are described; a test program storage that stores a test program including an environment command function for starting the verification task; and a logical simulator that performs a logical simulation according to the test program. According to another embodiment of the present invention, a system LSI verification system that verifies a processor module included in a system LSI, the system comprising: a circuit description storage that stores description data that describe a design of the processor module; a configuration file storage that stores a verification environment specification file in which specifications of a verification environment are described; a verification environment generator that generates the verification environment based on the description data and the verification environment specification file; and a logical simulator that performs a logical simulation according to a test program. According to another embodiment of the present invention, a system LSI verification method for verifying a processor module contained in a system LSI, the method comprising: storing description data of design of the processor module as a verified object; generating a verification task based on the description data and a verification environment specification file in which specifications of a verification environment are described; storing a test program including an environment command function for starting the verification task; and performing a logical simulation according to the test program.

BRIEF DESCRIPTION OF THE DRAWINGS

A general architecture that implements the various feature of the invention will now be described with reference to the drawings. The drawings and the associated descriptions are provided to illustrate embodiments of the invention and not to limit the scope of the invention.

FIG. 3 is an example of data of a global memory map file of the system LSI verification system according to the best mode of the present invention;

FIG. 4 is an example of data of a local memory map file of the system LSI verification system according to the best mode of the present invention;

FIG. 5 is an example of data of a control bus address map file of the system LSI verification system according to the best mode of the present invention;

FIG. 6 is an example of data of a verification reserved area definition file of the system LSI verification system according to the best mode of the present invention;

DETAILED DESCRIPTION

An embodiment of the present invention will be explained with reference to the drawings hereinafter. Here, the same or like reference symbols are affixed to the same or like portions in the description of following drawings.

Figure 1:
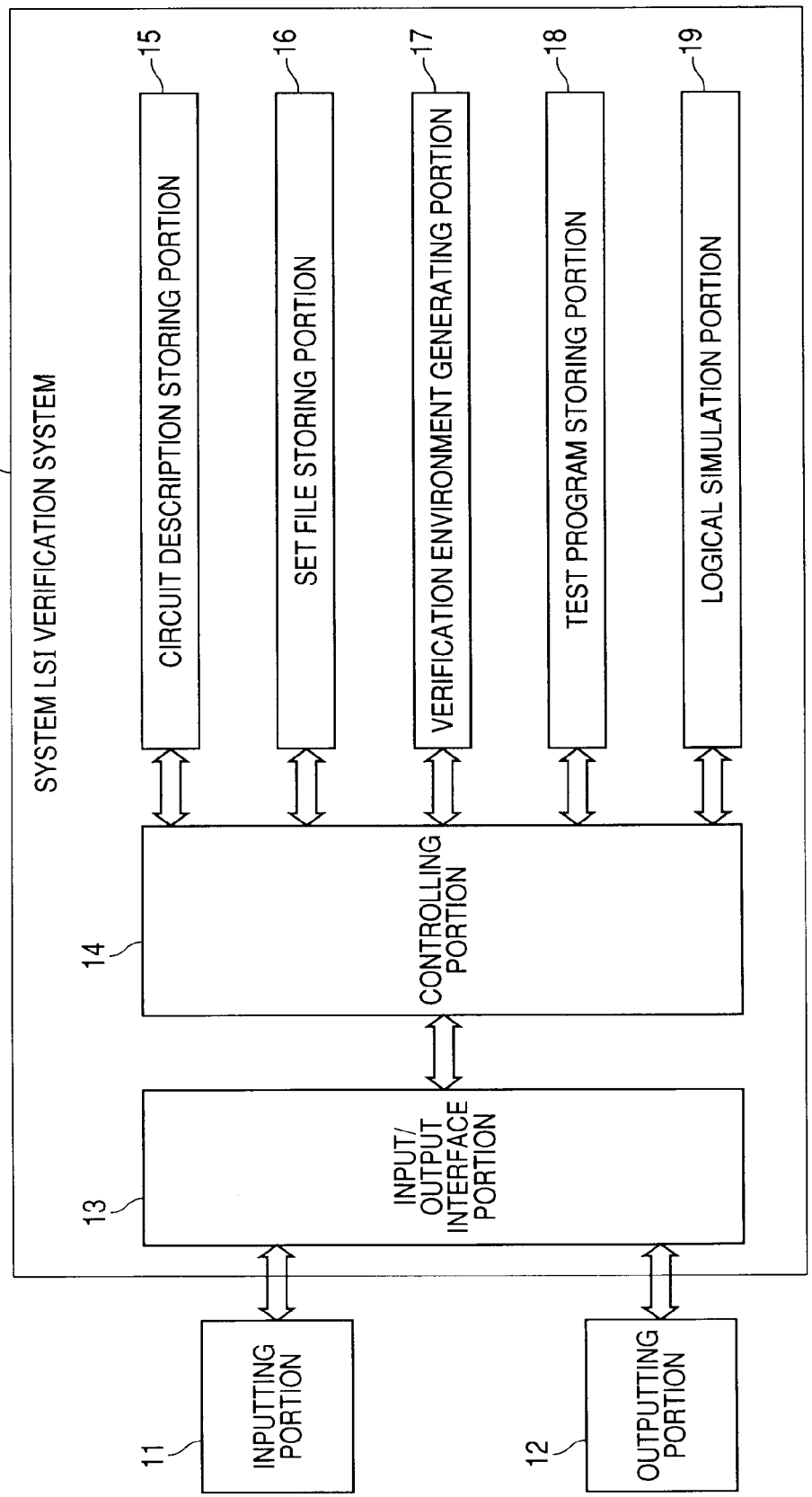
FIG. 1 is an exemplary configurative view of a system LSI verification system according to a best mode of the present invention.

A system LSI verification system 10 according to an embodiment of the present invention is a system that verifies a processor module contained in a system LSI. As shown in FIG. 1, the system LSI verification system 10 is connected to an inputting portion 11 and an outputting portion 12. The inputting portion 11 is a keyboard, a mouse, or the like. The inputting portion 11 inputs information to the system LSI verification system 10 by the user's operation. The outputting portion 12 is a display, or the like. The processed result, and the like of the system LSI verification system 10 are displayed on the outputting portion 12.

The system LSI verification system 10 includes an input/output interface portion 13, a controlling portion 14, a circuit description storing portion 15, a set file storing portion 16, a verification environment generating portion 17, a test program storing portion 18, and a logical simulation portion 19.

The input/output interface portion 13 input the data input from the inputting portion 11 into the controlling portion 14, and outputs the data input from the controlling portion 14 to the outputting portion 12. The controlling portion 14 controls operations of respective portions of the input/output interface portion 13, the circuit description storing portion 15, the set file storing portion 16, the verification environment generating portion 17, the test program storing portion 18, and the logical simulation portion 19, which are provided to the system LSI verification system 10.

Description data in design of the processor module as the verified object are stored in the circuit description storing portion 15. Concretely, the description data in design of the processor module is RTL (Register Transfer Language), for example.

Figure 2:
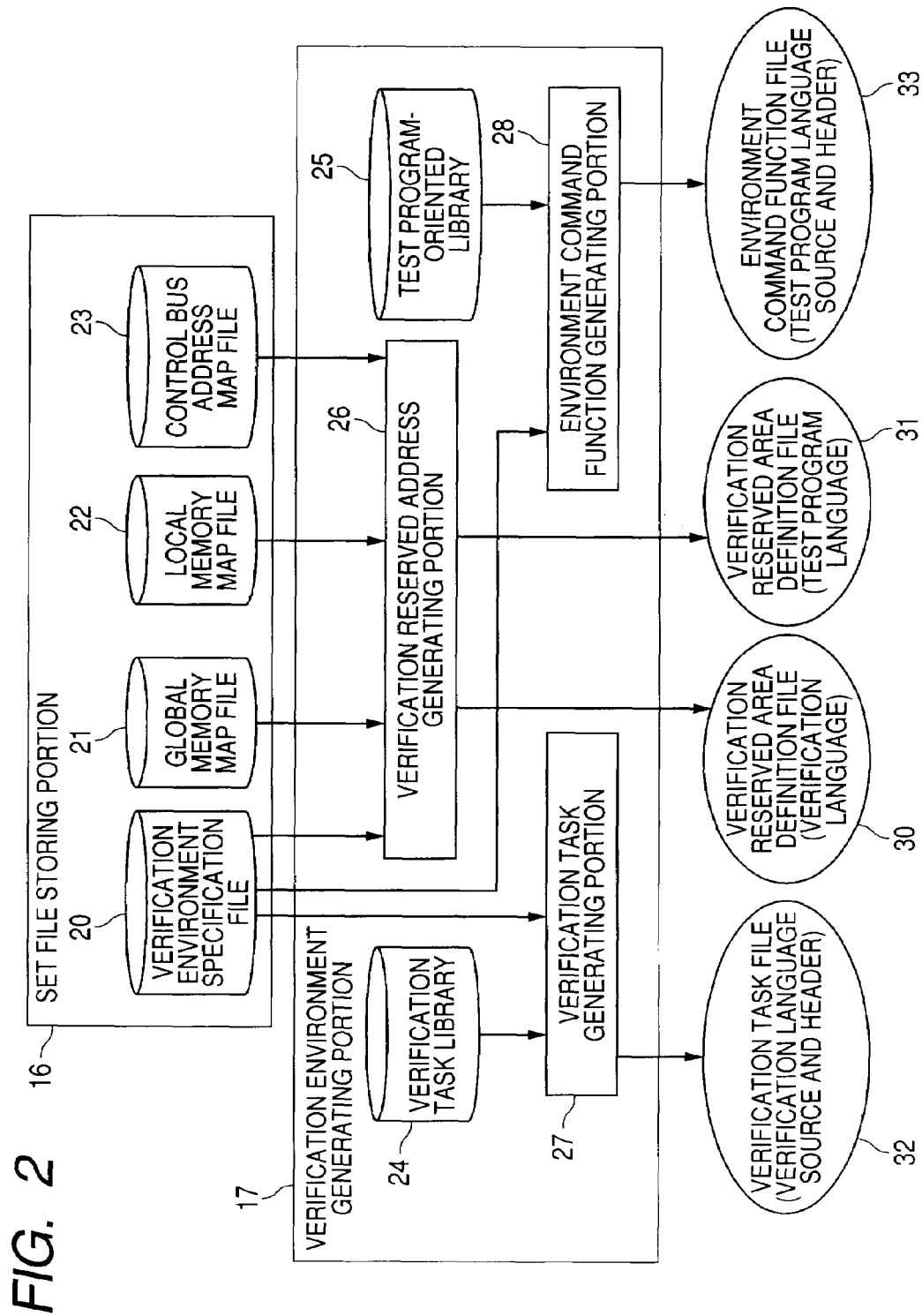
FIG. 2 is an exemplary view explaining in detail a verification environment generation portion of the system LSI verification system according to the best mode of the present invention.

Files referred to when the verification environment is generated by the verification environment generating portion 17 are stored in the set file storing portion 16. As shown in FIG. 2, a verification environment specification file 20, a global memory map file 21, a local memory map file 22, and a control bus address map file 23 are stored in the set file storing portion 16. The verification environment specification file 20, the local memory map file 22, and the control bus address map file 23 are prepared every processor module as the verified object. In contrast, the global memory map file 21 is prepared every system LSI in which the processor module as the verified object is contained. In addition, a machine instruction function header file generated in the system LSI development environment by using a configuration file of the processor module as an input, and the like may be contained in the set file storing portion 16.

When the information used to form the verification environment is input from the inputting portion 11, the verification environment generating portion 17 forms the verification environment according to the processor module as the verified object and the verification specification. As shown in FIG. 2, a verification task file 32, verification reserved area definition files 30 and 31, and an environment command function file 33 are contained in the verification environment. This verification environment may be stored in test program storing portion 18.

A plurality of test programs and functions and definitions called by these test programs are stored in the test program storing portion 18. An interface used to call the environment command function applied to start the verification task is provided to the test programs. The test programs are described like the firmware, for example. The verification task file 32, the verification reserved area definition files 30 and 31, and the environment command function file 33, which are output from the verification environment generating portion 17, may be stored in the test program storing portion 18.

The logical simulation portion 19 runs a logical simulation through a test program stored in the test program storing portion 18. Also, when the writing occurs in the reserved address that is equivalent to the command described in the verification reserved area definition file 30 described later, the logical simulation portion 19 informs the verification task of such situation and starts an action. This reserved address is the address of the external memory of the system LSI as the verified object, for example.

Next, the set file storing portion 16 and the verification environment generating portion 17 shown in FIG. 1 will be explained with reference to FIG. 2 hereunder.

In the verification environment specification file 20, descriptions such as (1) a command indicating whether the verification reserved area should be allocated to the external memory of the processor module or other areas, (2) a choice of a verification model that is connected to the external interface of the processor module, (3) a choice indicating whether or not a monitor for the inside of the processor core or a monitor for various buses should be provided, and the like are contained. Here, a global bus model, an external signal input/output model of a processor module, and the like correspond to this verification model.

The global memory map file 21 is a file in which a memory map of memories allocated to the system LSI is described. Concretely, data given in FIG. 3 are described in the global memory map file 21.

The local memory map file 22 is a file in which a memory map of memories allocated to the processor module as the verified object is described. Concretely, data given in FIG. 4 are described in the local memory map file 22.

The control bus address map file 23 is a file in which an address map of control buses allocated to the control bus of the processor module as the verified object is described. Concretely, data given in FIG. 5 are described in the control bus address map file 23.

The verification environment generating portion 17 includes a verification task library 24, a test program-oriented library 25, a verification reserved address generating portion 26, a verification task generating portion 27, and an environment command function generating portion 28.

The verification tasks used in the verification are stored in the verification task library 24. In the verification tasks, for example, tasks connected to input/output signals of the processor module such as clock signal, reset signal, debug signal, etc., external signal input/output control tasks connected to interfaces of hardware engines of the processor module to the external device, monitor tasks connected to the inside of the processor core, and others are contained. Also, in order to verify functions of RTL and debug the test program, control bus monitor tasks connected to the control bus of the processor module, bridge monitor tasks connected to the bridge of the processor module, and others may be contained. In addition, templates for the verification tasks for which the formal address is set may be stored in the verification task library 24.

The environment command functions used in the test program are stored in the test program-oriented library 25.

The verification reserved address generating portion 26 outputs verification reserved area definition files 30 and 31 in which reserve addresses decided to start the verification task as the command are recorded. The verification reserved address generating portion 26 outputs the verification reserved area definition file, based on the circuit description data, the global memory map file 21, the local memory map file 22, and the control bus address map file 23. The verification reserved address generating portion 26 outputs the verification reserve area definition file 30 in which the verification task is described in referable verification language and the verification reserved area definition file 31 in which the test program is described in referable verification language.

As shown in FIG. 6, reserved addresses decided to start the verification task common to a plurality of processor modules contained in the system LSI as the command, and reserved addresses decided to start the verification task peculiar to the processor module as the verified object as the command are described in the verification reserved area definition file 30 individually. In an example shown in FIG. 6, the verification reserved area definition file corresponds to such a situation that the task to assert the interrupt signal from other modules should be prepared as the verification task common to a plurality of processor modules and the verification task peculiar to the processor module as the verified object in the verification environment is shown in the verification environment specification file 20. The reserved addresses peculiar to the processor module as the verified object are replaced every verified object. Also, the verification reserved area definition files 30 and 31 are mapped into a particular reserved area of the memory model such as SDRAM, or the like connected to the external of the processor module. This reserved area is controlled not to used for purposes except the verification reserved definition.

As the command common to the processor module, respective processes of end of test program, output of end status, memory output, and input/output of an external signal of the processor module are listed. In contrast, as the command peculiar to the processor module as the verified object, an interruption verifying function from the outside of the module, a hardware engine associated external interface verifying function, and the like are listed. When the system LSI having a multi-processor construction is verified in this manner, maintenance of environment can be facilitated by managing the portion common to all processor modules and the portion peculiar to the processor module as the verified object individually.

In FIG. 6, the verification reserved area definition file 30 that the verification task looks up is set forth. Similarly, in the verification reserved area definition file 31 that the test program looks up, reserve addresses common to respective processor modules and the verification task peculiar to the processor module as the verified object are recited individually.

Also, in the verification reserved area definition files 30 and 31, a pointer and a status of the memory in which processed results of the parameter and the function are stored are described every function of the task or the environment command function. Also, because a version management address, an address used to manage ID of the processor module, etc. are set in the verification reserved area definition files 30 and 31, these files can deal easily with a subsequent change of design specification in combination with a change of the template or the library. Also, it is preferable that additional addresses should be set every group of the address definitions about one function in the verification reserved area definition files 30 and 31. Accordingly, these files can deal easily with the addition of the function switching flag or the parameter at a time of adding the specification of function by setting an initial value. Also, the test program using the function in a new specification can be added without correction of the existing test program that utilizes the function in an old version.

The verification task generating portion 27 generates the verification task file 32 based on the verification environment specification file 20 and the verification task library 24. This verification task file 32 contains a source file and a header file that are described in verification language. The verification task necessary for the verification is selected based on the verification environment specification file 20. Also, when the template of the verification task for which the formal address is set is stored in the verification task library 24, the template of the verification task necessary for the verification is selected based on the verification environment specification file 20 and then the verification task file 32 is generated by replacing the formal address of the template of the selected verification task with the reserved address stored in the verification reserved area definition file 30. The verification task file 32 is executed by the logical simulation portion 19 as the verification task.

The environment command function generating portion 28 generates the environment command function file 33 by selecting the environment command function necessary for the test program from the test program-oriented library 25 based on the verification environment specification file 20 and the test program-oriented library 25. For example, the environment command function file 33 is the header file and the program source described in test program language. The user can grasp the functions and the items that can be called up from the test program, by looking up the environment command function file 33.

Figure 7:
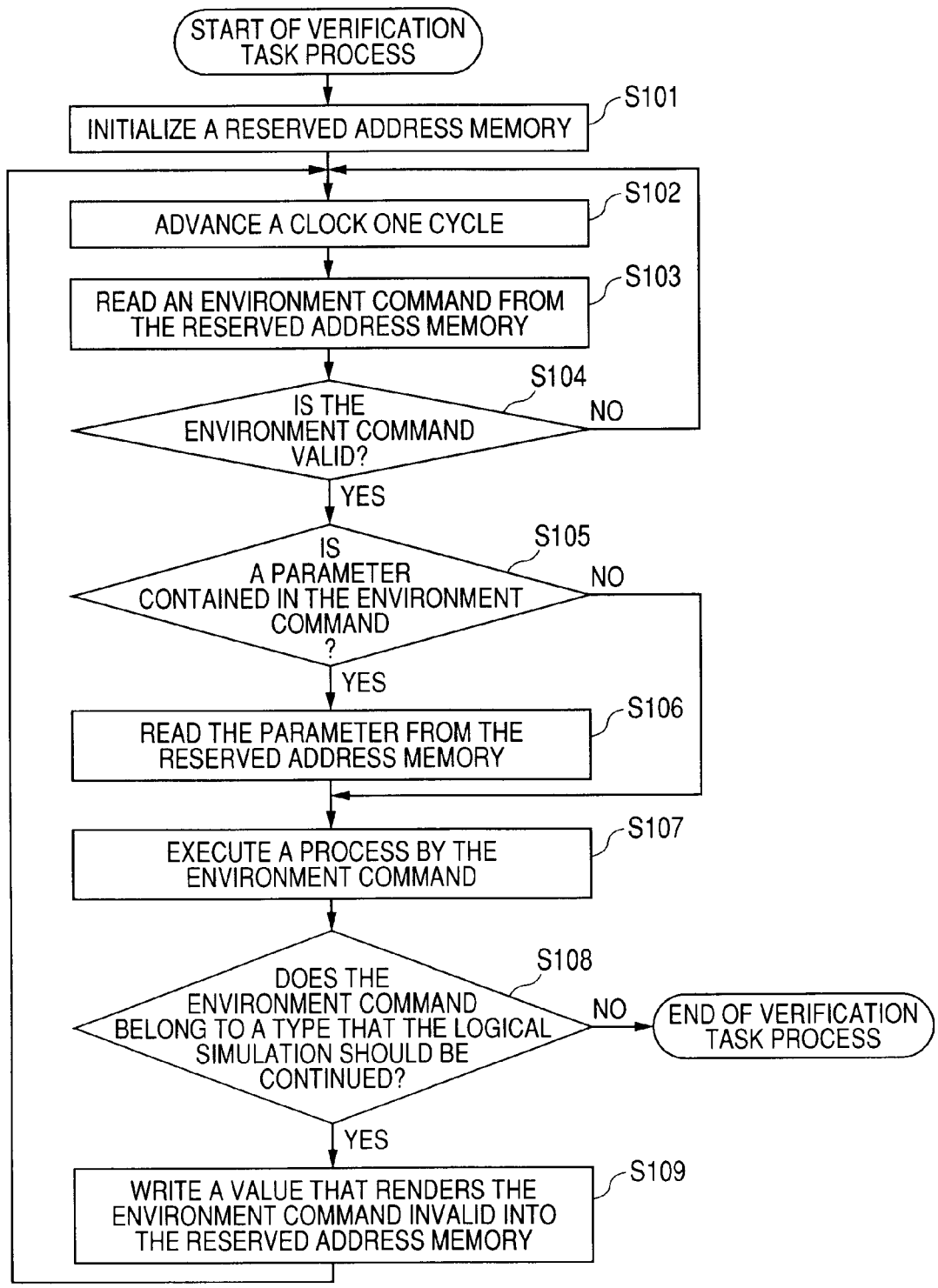
FIG. 7 is an exemplary flowchart explaining an example of a process of a verification task of the system LSI verification system according to the best mode of the present invention.

Next, process of the verification task of the system LSI verification system 10 according to the best mode of the present invention will be explained with reference to FIG. 7 hereunder.

First, in step S101, the memory of the reserved address defined by the verification reserved area definition files 30 and 31 is initialized.

Then, in step S102, a clock is advanced one cycle. Then, in step S103, the environment command is read from the reserved address memory. In step S104, if it is decided that the environment command is not valid, the process goes back to step S102. In contrast, in step S104, if it is decided that the environment command is valid, the process goes to step S105.

In step S105, if it is decided that the parameter is contained in the environment command, the parameter is read from the reserved address memory in step S106, and then the process goes to step S107. In contrast, in step S105, if it is decided that the parameter is not contained in the environment command, the process goes to step S107.

In step S107, the process based upon the environment command is executed. Then, in step S108, it is decided whether or not the environment command belongs to the type that the logical simulation should be continued. If it is decided that the environment command belongs to the type that the logical simulation should be continued, the value that renders the environment command invalid is written into the reserved address memory in step S109, and then the process goes to step S102. In contrast, in step S108, if it is decided that the environment command does not belong to the type that the logical simulation should be continued, the process of the verification task is ended.

Figure 8:
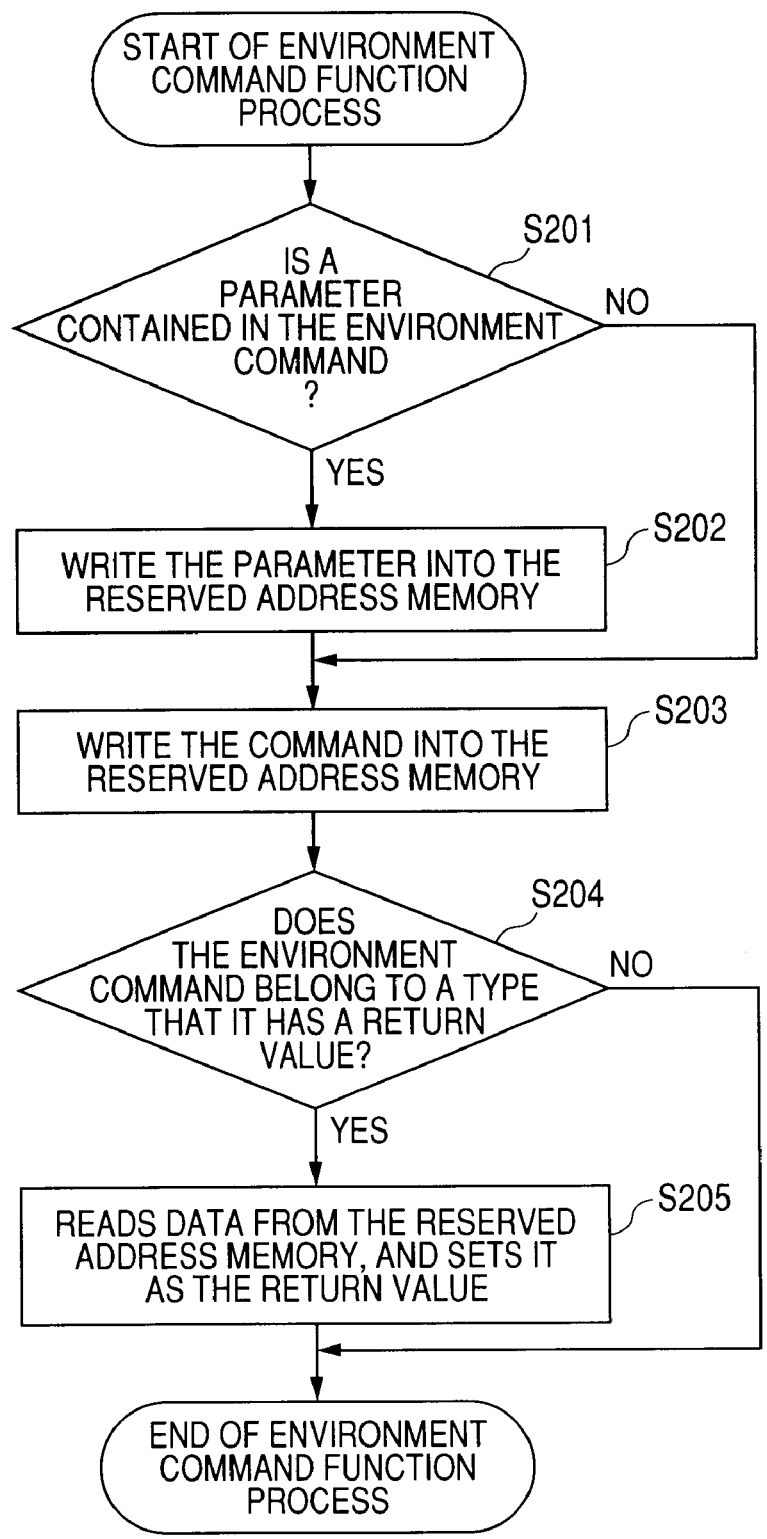
FIG. 8 is an exemplary flowchart explaining an example of a process of an environment command function of the system LSI verification system according to the best mode of the present invention.

Next, the process of the environment command function that the test program of the system LSI verification system 10 according to the best mode of the present invention calls up will be explained with reference to FIG. 8 hereunder.

First, in step S201, it is decided whether or not the parameter is contained in the environment command. In step S201, if it is decided that the parameter is contained in the environment command, the parameter is written into the reserved address memory in step S202, and the process goes to step S203. In contrast, in step S201, if it is decided that the parameter is not contained, the process goes to step S203.

In step S203, the command is written into the reserved address memory. Then, in step S204, it is decided whether or not the environment command belongs to the type that it has a return value. If it is decided that the environment command belongs to the type that it has the return value, the data is read from the reserved address memory, and is sent back as the return value in step S205. Then, the process of environment command function is ended. In contrast, if it is decided that the environment command does not belong to the type that it has the return value, the process of environment command function is ended as it is.

Next, the system LSI will be explained with reference to FIG. 9 hereunder. The system LSI verification system 10 according to the best mode of the present invention verifies the processor module contained in a system LSI 110 shown in FIG. 9. Here, a plurality of processor modules contained in the system LSI 110 is called a multi-processor module hierarchy. Respective processor modules contained in the system LSI 110 are called a processor module hierarchy 105.

Figure 9:
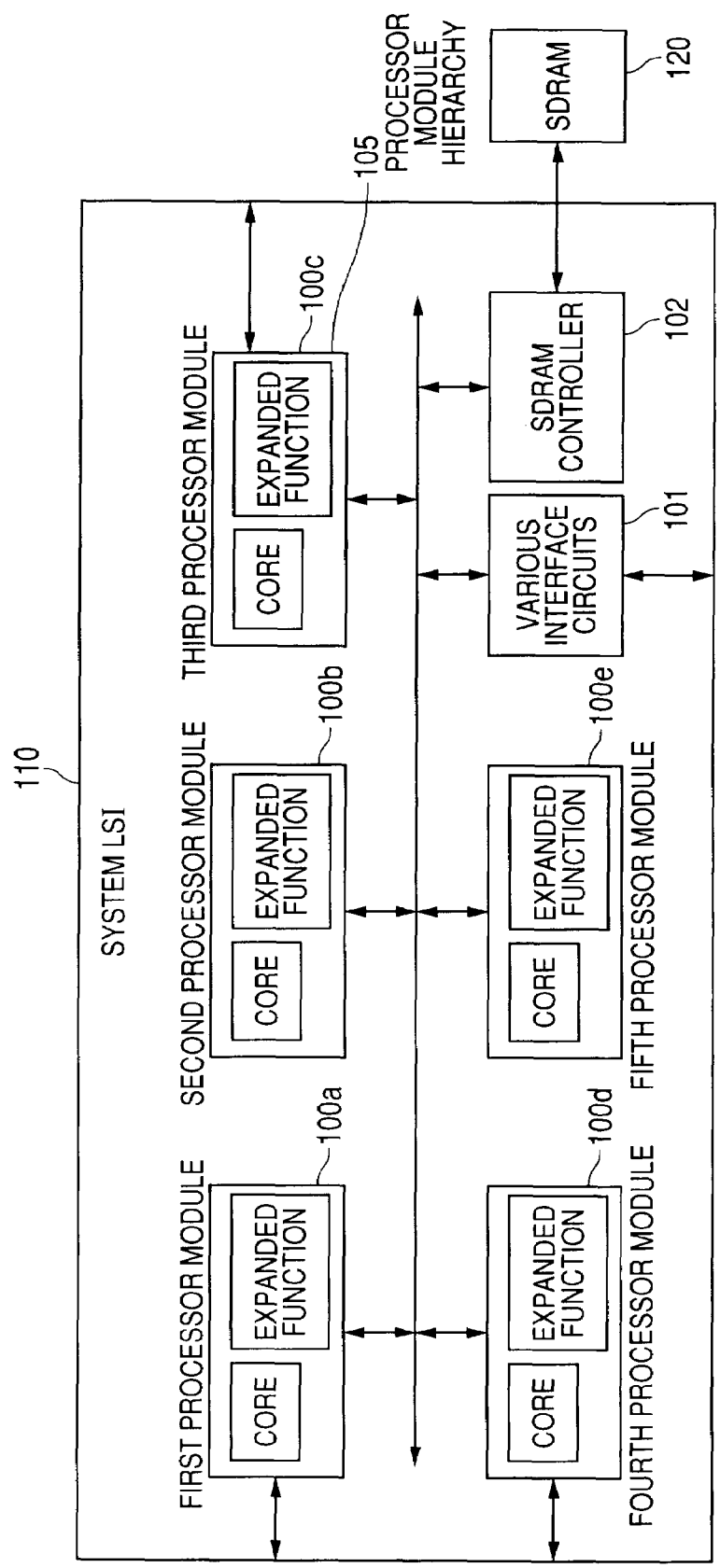
FIG. 9 is an exemplary view explaining a system LSI containing a processor module as a verified object of the system LSI verification system according to the best mode of the present invention.

The system LSI 110 shown in FIG. 9 includes a first processor module 100*a* to a fifth processor module 100*e*, which are connected mutually via a global bus. Here, the case where the system LSI 110 has five processor modules is illustrated, but the system LSI 110 may have any number of processor modules. Also, the system LSI 110 may have various interface circuits 101 that serve as interfaces with the external device, and an SDRAM controller 102 connected to an external SDRAM 120.

Figure 10:
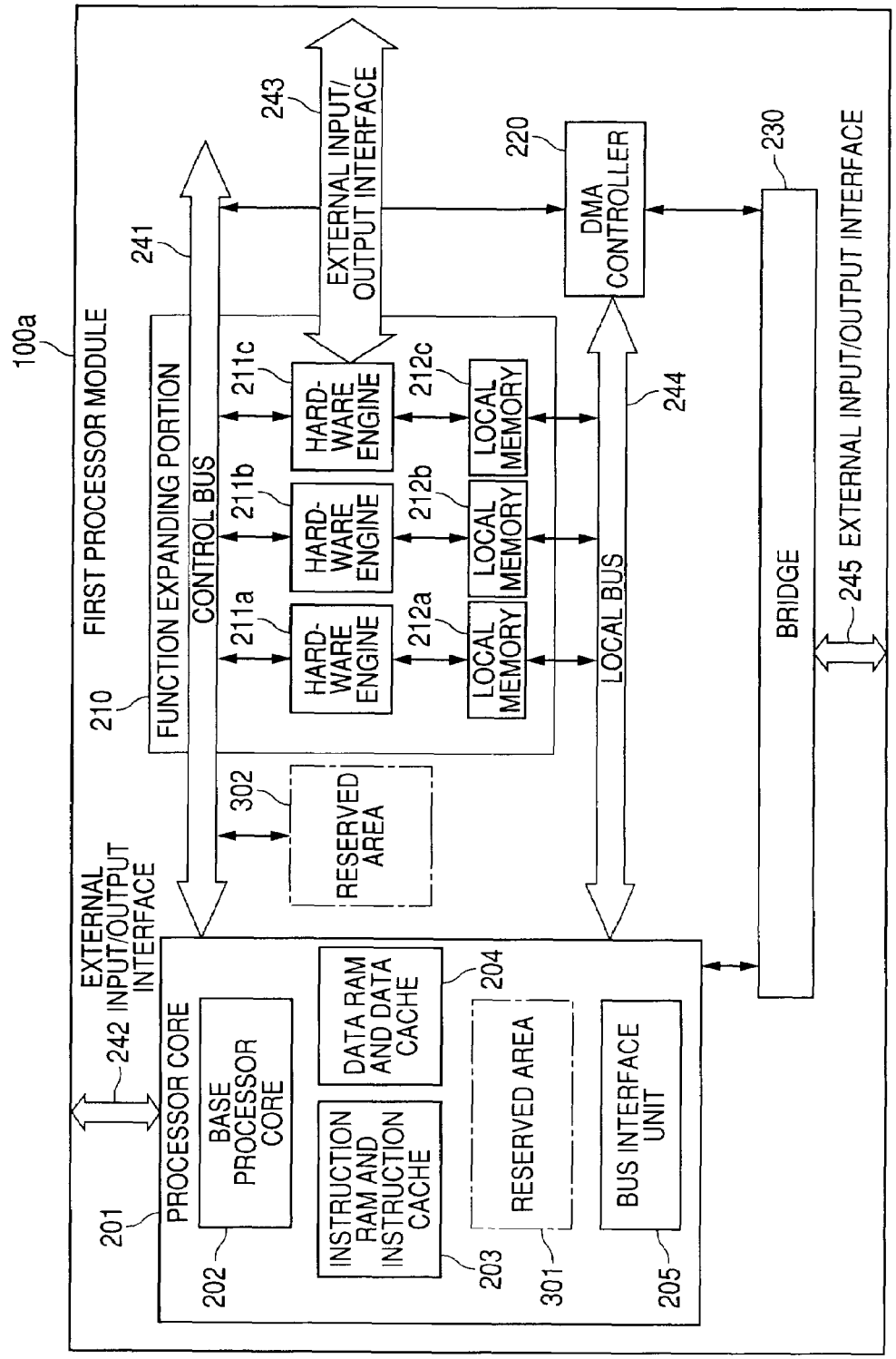
FIG. 10 is an exemplary view explaining the processor module as the verified object of the system LSI verification system according to the best mode of the present invention.

The first processor module 100*a* as the verified object will be explained with reference to FIG. 10 hereunder. The first processor module 100*a* includes a processor core 201, a function expanding portion 210, a DMA controller 220, and a bridge 230.

A construction of the processor core 201 is selected by a configuration. The processor core 201 has modules such as a base processor core 202, an instruction RAM and instruction cache 203, a data RAM and data cache 204, a bus interface unit 205, and the like.

The function expanding portion 210 can deal with plural types of hardware expansion and, for example, has hardware engines 211*a* to 211*c* and local memories 212*a* to 212*c* that the hardware engines 211*a* to 211*c* access every function expansion.

The DMA controller 220 executes data transfer between the local memories 212*a* to 212*c* connected to a local bus 244 and a data RAM in the processor core 201, for example, and data transfer between an internal memory in the processor module 100*a* and an external memory via the bridge 230.

The control bus 241 connects the processor core 201 and the hardware engines 211*a* to 211*c* and a control register of the DMA controller 220. An external input/output interface 242 connects the processor core 201 and the external device. An external input/output interface 243 connects the hardware engines of the function expanding portion 210 and the external device. The local bus 244 connects the processor core 201, the local memories 212*a* to 212*c*, and the DMA controller 220. The bridge 230 is a bridge that is connected to a global bus model and bridge monitor tasks in the verification environment of the system LSI verification system 10. An external input/output interface 245 connects the bridge 230 and the global bus model.

Figure 11:
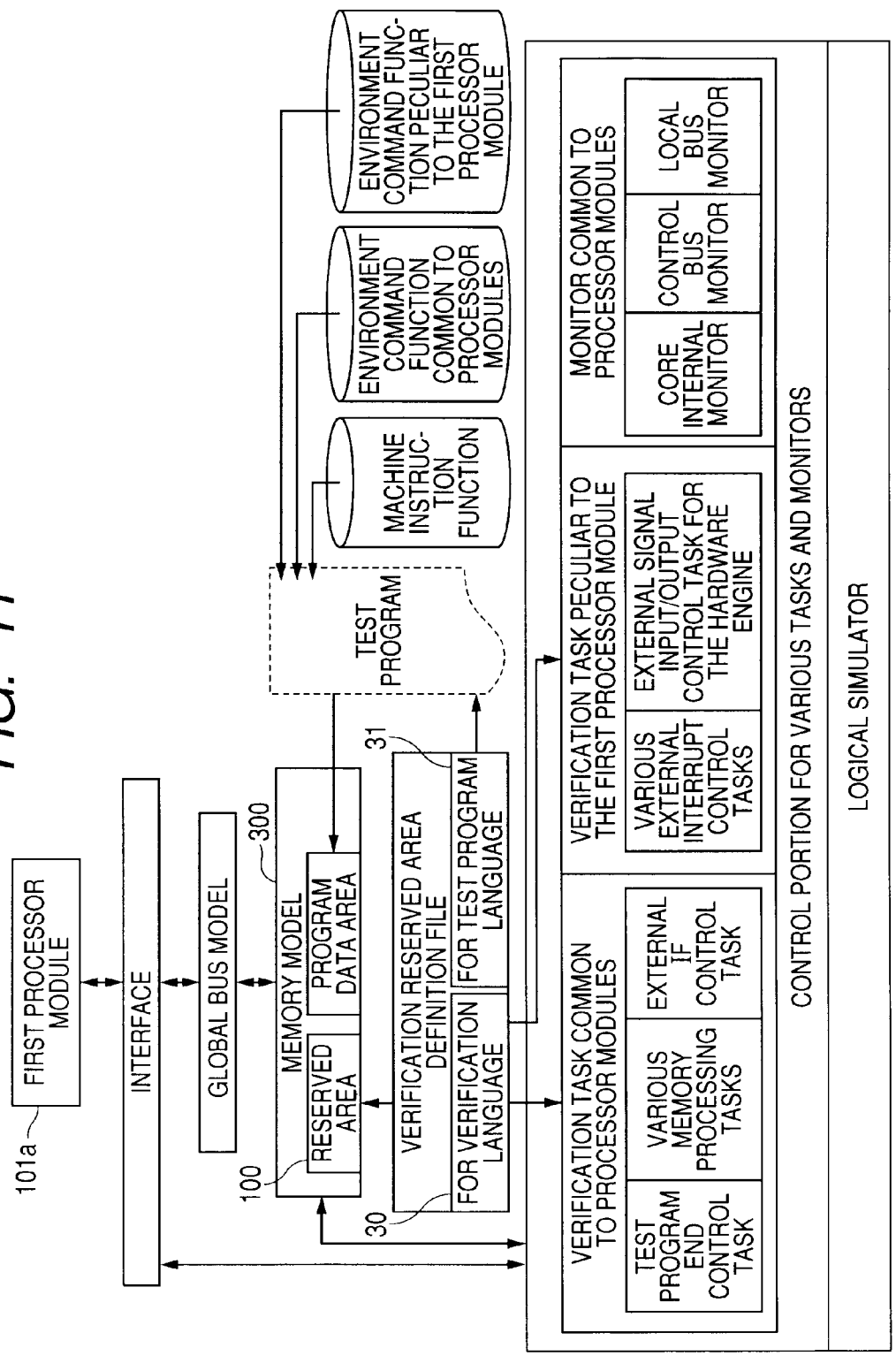
FIG. 11 is an exemplary view explaining an outline of a verification environment of the system LSI verification system according to the best mode of the present invention.

Next, the verification environment of the system LSI verification system according to the best mode of the present invention will be explained with reference to FIG. 11 hereunder.

The first processor module 101*a* as the verified object is verified via the interface of the system LSI verification system 10. The interface is connected to a simulator via the global bus model, a memory model 300, and the verification reserved area definition file.

The memory model 300 is a simulation model equivalent to the external SDRAM 120, and has a reserved area 100 and an area in which the program and the data are stored. The reserved area 100 is defined by the verification reserved area definition files 30 and 31. As the verification reserved area definition file, the verification reserved area definition file 30 for the verification language described in verification language and referred to by the verification task, and the verification reserved area definition file 31 for test program language referred to by the test program are provided.

The test program is formed based on the machine instruction function, the environment command function common to the processor modules of the system LSI, the environment command function peculiar to the first processor module 100*a* as the verified object, and the verification reserved area definition file 31 for test program language.

The simulator includes the verification tasks and monitors, the control portions for various tasks and monitors, and the logical simulator. As the verification task, the verification task common to the processor modules and the verification task peculiar to the first processor module as the verified object can be listed. As the verification task common to the processor modules, there are the test program end control task, various memory processing tasks, the external interface control task, and the like. As the verification task peculiar to the processor module, there are various external interrupt control tasks, the external signal input/output control task for the hardware engine, and the like. As the monitor common to processor modules, the core internal monitor, the control bus monitor, the local bus monitor, and the like are considered.

According to the system LSI verification system of the best mode of the present invention, the verification reserved area can be defined in unit of processor module contained in the system LSI. Also, the reserved address common to the processor modules contained in the system LSI and the reserved address peculiar to the processor module as the verified object are managed individually. Therefore, ease of modification caused due to the change of specifications of the test program and also portability to other modules can be improved.

Also, according to the system LSI verification system of the best mode of the present invention, such a mode is employed that the address used to start a task function is not directly accessed from the test program but the verification task is controlled via the environment command function. Because the verification reserved area definition file is accessed by both the test program and the verification task, such file is prepared in respective languages. In this manner, since management using the environment command function is employed, ease of modification caused due to the change of specifications of the test program and also portability to other modules can be improved.

A variation of the best mode of the present invention will be explained hereunder. In the best mode of the present invention, the case where the reserved area is provided to the outside of the system LSI 110 is explained. But the reserved area may be provided in an address space in the processor module.

The reserved area is an undefined area in the address into which instruction RAM, data RAM, and the like are not mapped, out of the memory space in the processor core 201 of the processor module as the verified object. Concretely, the undefined area in the memory space in the processor core 201 is a reserved area 301 as the verification memory model of the first processor module 1001 shown in FIG. 10.

Also, the reserved area may be an undefined area of a control bus space, into which control registers of the modules such as the hardware engine and the DMA controller in the processor module 100a are not mapped. Concretely, the undefined area of the control bus space is a reserved area 302 as the verification control register shown in FIG. 10. The verification control register may be accessed from the test program by using the undefined area. Also, a dummy circuit of the hardware engine having the control register in a necessary size of the verification reserved area may be set, and then the dummy circuit may be deleted after the verification is ended.

In this manner, in the variation of the best mode of the present invention, the undefined area is used as the reserved address for the purpose of verification. Therefore, there is no need to store the information necessary for the verification in the address space of the external memory model such as SDRAM, or the like, and the test program and the data can be arranged freely.

Also, the access to the undefined area may be handled as an error process depending on the specification of the processor module. Therefore, preferably a processor module operation undefined area out of the undefined area may be used. Also, the verification reserved area may be set by combining the undefined areas 301 and 302 with the external memory model having a memory space larger than these areas.

As described above, the best mode of the present invention and variation 1 are explained. It should not be interpreted that the description of the drawings constituting as a part of this disclosure limit the present invention. Various variations, modifications, and utilizing technologies become apparent for those skilled in the art based on this disclosure.

For example, the machine instruction function to execute the local memory access and the machine instruction function to execute the control register access in the control bus may be directly used in the test program not to form the environment command function. In this case, ease of modification caused due to the change of specifications of the test program and also portability to other modules are deteriorated, nevertheless such use is effective to the verified object that does not need the modification and the porting.

Also, operations of the verification task and model in the processor module hierarchy may be set in the reserved addresses having the same function such that the same value are kept in the verification environment in which the RTL simulation of plural hierarchies such as multi-processor module hierarchy, overall system LSI, or the like is carried out and the emulator running environment. In this case, the test program can be run in different verification environments and emulators without correction, and improvement in efficiency of the verification can be attained.

As described with reference to the embodiment, there is provided a system LSI verification system and the system LSI verification program capable of verifying easily the processor module of the system LSI can be provided.

It is of course that the present invention should contain various embodiments, and the like described herein. Therefore, a technical scope of the present invention should be decided only based on the invention specifying matters according to the adequate claims from the above explanation.

What is claimed is:

1. A system LSI verification system that verifies a processor module included in a system LSI, the system comprising:

a circuit description storage that stores description data that describes a design of the processor module;

a verification task generator that generates a verification task file, which is executable as a verification task, based on the description data and a verification environment specification file in which specifications of a verification environment are described;

a test program storage that stores a test program including an environment command function for starting the verification task;

a logical simulator that performs a logical simulation according to the test program; and a reserved address generator that generates a definition file in which a reserved address for starting the verification task as a command is recorded, wherein, when a write access occurs to the reserved address, the logical simulator notifies the verification task to start an action.

2. The system LSI verification system according to claim 1, wherein the verification task generator selects the verification task necessary for a verification from a verification task library in which a plurality of verification tasks are stored based on the verification environment specification file and generates the verification task file for the selected verification task.

3. The system LSI verification system according to claim 1, further comprising:

an environment command function generator that selects the environment command function necessary for the test program from a test program library in which a plurality of environment command functions are stored based on the verification environment specification file and generates the environment command function file and the test program.

4. The system LSI verification system according to claim 1, wherein the definition file includes a version management address and an address used to manage ID of the processor module.

5. A system LSI verification system that verifies a processor module included in a system LSI, the system comprising:
a circuit description storage that stores description data that describe a design of the processor module;
a configuration file storage that stores a verification environment specification file in which specifications of a verification environment are described;
a verification environment generator that generates the verification environment based on the description data and the verification environment specification file; and
a logical simulator that performs a logical simulation according to a test program,
wherein the verification environment generator includes a verification task generator that selects a verification task necessary for a verification from a verification task library in which the verification task for the verification is stored based on the verification environment specification file and generates a verification task file for the selected verification task, and
the verification environment generator includes a reserved address generator that generates a definition file in which a reserved address for starting the verification task as a command is recorded, and an environment command function generator that selects a environment command function necessary for the test program from a test program library in which the environment command function used in the test program is stored based on the verification environment specification file, and generates an environment command function file which is executable as the environment command function.

6. The system LSI verification system according to claim 5, wherein the configuration file storage further stores a global memory map file, a local memory map file, and a control bus address map file.

7. The system LSI verification system according to claim 5, wherein the definition file includes a version management address and an address used to manage ID of the processor module.

8. The system LSI verification system according to claim 5, wherein the test program includes an interface used to call the environment command function for starting the verification task.

9. The system LSI verification system according to claim 5, wherein, when a write access occurs to the reserved address, the logical simulator notifies the verification task to start an action.

10. A system LSI verification method for verifying a processor module contained in a system LSI, the method comprising:
storing description data of design of the processor module as a verified object;
generating a verification task based on the description data and a verification environment specification file in which specifications of a verification environment are described;
storing a test program including an environment command function for starting the verification task;
performing a logical simulation according to the test program; and
generating a definition file in which a reserved address decided for starting the verification task as a command is recorded,
wherein, when a write access occurs to the reserved address, the write access is informed the verification task and causes to start an action.

11. The system LSI verification method according to claim 10, wherein the verification task generating step includes selecting the verification task necessary for a verification from a verification task library in which a plurality of verification tasks are stored based on the verification environment specification file and generating a verification task file for the selected verification task.

12. The system LSI verification method according to claim 10, further comprising:
selecting the environment command function necessary for the test program from a test program library in which a plurality of environment command functions are stored based on the verification environment specification file; and
generating an environment command function file and the test program.

* * * * *